United States Patent [19]

Pfaff

[11] 4,380,736
[45] Apr. 19, 1983

[54] PERIPHERAL INTERFACE ADAPTER CIRCUIT FOR COUNTER SYNCHRONIZATION

[75] Inventor: William Pfaff, Round Rock, Tex.

[73] Assignee: Motorola, Inc., Schaumburg, Ill.

[21] Appl. No.: 260,520

[22] Filed: May 4, 1981

[51] Int. Cl.³ ................ H03K 17/00; H03K 5/13; H03L 7/00
[52] U.S. Cl. .................................. 328/73; 328/74; 307/269; 307/475
[58] Field of Search ............... 328/37, 48, 63, 72, 328/73, 74; 307/475, 269

[56] References Cited

U.S. PATENT DOCUMENTS 2,971,157  2/1956  Harper ............................ 328/43
3,051,855  8/1962  Lee ................................ 328/43

Primary Examiner—John S. Heyman
Assistant Examiner—Timothy P. Callahan
Attorney, Agent, or Firm—Anthony J. Sarli, Jr.; Jeffrey Van Myers; James L. Clingan, Jr.

[57] ABSTRACT

A peripheral interface adapter circuit provides a synchronized signal to a counter in response to an asynchronous signal and a synchronizing signal from a microcomputer. A shift register transfer signal is also provided to a shift register for enabling the shift register to receive and store a count from the counter.

7 Claims, 3 Drawing Figures

PERIPHERAL INTERFACE ADAPTER CIRCUIT FOR COUNTER SYNCHRONIZATION

TECHNICAL FIELD

This invention relates to peripheral interface adapter circuits, and particularly to a circuit for counting asynchronous signals in synchronization with a microcomputer.

BACKGROUND ART

Peripheral interface adapter circuits have been developed to assist in interfacing a microcomputer with systems which are asynchronous with the microcomputer. One problem in this regard is providing a count of asynchronously received signals to the microcomputer. A read portion of a system cycle of the microcomputer may occur while a counter is updating its count of the asynchronous signals. Because an output of the counter may be invalid during the update, the count read by the microcomputer would be considered invalid.

Measures must be taken to ensure that the counter output is stable long enough before the read portion of the cycle is completed for the microcomputer to complete the reading of the counter contents. Because peripheral interface adapter circuits may be separated from the microcomputer by a significant distance, it is desirable to require as few signals from the microcomputer as possible to achieve synchronization. Consequently, only one synchronizing signal may be available.

The duration of time that the asynchronous signal is present to be counted may not be known. Consequently, it is important to be able to count independently of the duty cycle of the asynchronous signal.

The faster a counter must be, the larger the chip area required for the counter. The counter may be a ripple counter or a synchronous counter. Synchronous counters are faster than ripple counters by the nature of the design. Synchronous counters, however, require more devices and therefore more chip area. The speed of ripple counters is related to the speed of the devices from which it is made. Because faster devices require more chip area, the faster the ripple counter the more chip area required. It is therefore desirable to know how much time is available for the counter to perform its function so that the counter can so be designed to minimize the chip area occupied by the counter.

The frequency of the asynchronous signals to be counted may be unknown. A synchronizing circuit for handling such signals must be able to handle low as well as high frequencies The higher the frequency that can be counted, the better.

BRIEF SUMMARY OF THE INVENTION

A peripheral interface adapter circuit with a synchronizing circuit for synchronizing an asynchronous signal and providing it to a counter so that a valid read of the counter can be made by a microcomputer is disclosed.

An input storage means receives the asynchronous signal and provides a transfer signal to an output storage means. If the asynchronous signal is being provided to the output storage means, the output storage means provides a synchronized output signal to the counter when a synchronizing signal is received. The counter then updates its count. The synchronized output signal is fed back to the input storage means to reset it so it can receive another asynchronous signal.

The synchronizing signal is provided by the microcomputer a predetermined time before the microcomputer will attempt a read. The microcomputer reads the counter via a shift register which is coupled to the counter. A transfer storage means is coupled to the output storage means for receiving the synchronized output signal from the output storage means. Responsive to the synchronized output signal, the transfer storage means provides a shift register enable signal to the shift register. Upon receiving this signal, the shift register stores the count of the counter. This shift register is coupled to a data bus of the microcomputer. Upon receiving a counter read request from the microcomputer, the shift register provides the stored count to the data bus for the microcomputer to read.

When the output storage means provides a synchronized output signal, it is reset via a first reset logic means when the synchronizing signal is removed. When the transfer storage means provides a shift register enable signal, it is reset via a second logic means when another synchronizing signal is received.

DETAILED DESCRIPTION OF THE PREFERRED EMBODIMENT

Figure 1:
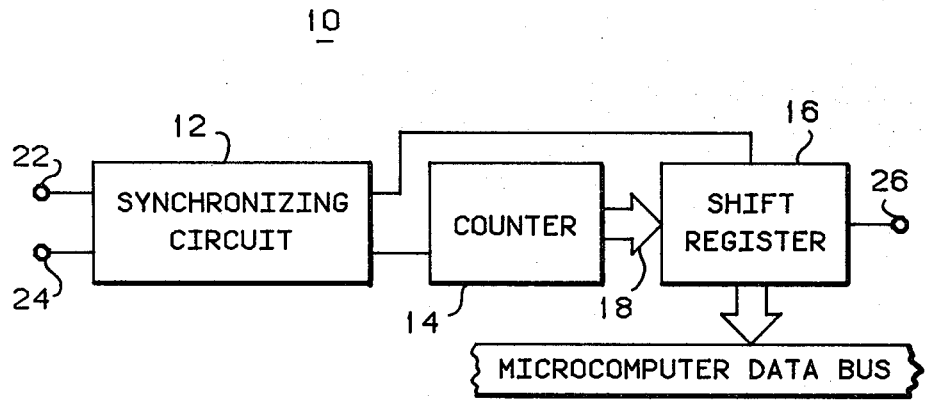
FIG. 1 is a block diagram of the peripheral interface adapter circuit showing the synchronizing circuit, the counter, the shift register and the microcomputer data bus.

In FIG. 1 a peripheral interface adapter circit 10 is shown with a synchronizing circuit 12 coupled to a counter 14 and a shift register 16. The counter 14 is coupled to the shift register via counter data bus line 18. The shift register 16 is coupled to a data bus 20 of a microcomputer. An asynchronous input signal is recieved on terminal 22 which is connected to the synchronizing circuit 12. A synchronizing signal from the microcomputer is recieved by the synchronizing circuit 12 on terminal 24.

The synchronizing circuit 12 provides synchronizing output signals to the counter 14 to be counted. A synchronized signal is provided when a synchronizing signal is recieved if an asynchronous signal has already been received. If no asynchronous signal is received between successive signals, then no synchronized signal is provided when the second synchronizing signal is received. If one or more asynchronous signals are received during this time period, one synchronized signal is provided when the second synchronizing signal is provided.

The synchronizing circuit 12 also provides shift register enable signals to the shift register 16. When a shift register transfer signal is present, the shift register 16 stores a count received from the counter 14 via counter data bus line 18. The shift register enable signal is provided responsive to an asynchronous signal and a synchronizing signal. If an asynchronous signal is received between the time when a first synchronizing signal is received and the time when a second synchronizing signal is received, a shift register enable signal is provided when the second synchronizing signal is removed. The shift register transfer signal is removed when a third synchronizing signal is provided.

The shift register 16, which operates in a parallel in/parallel out mode, comprises conventional input logic, latch, and output logic. Responsive to the shift register enable signal, the input logic couples the counter output to the latch which stores the logic state received and provides an output indicative thereof. Responsive to a counter read signal, the output logic couples the output of the latch to the microcomputer data bus 20.

Figure 2:
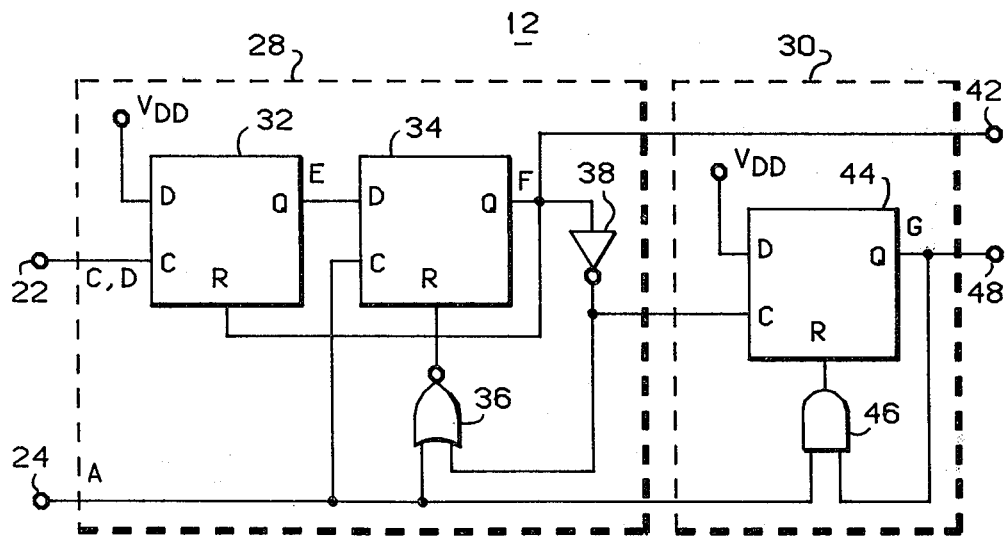
FIG. 2 is a logic diagram of the synchronizing circuit of FIG. 1.

In FIG. 2 the synchronizing circuit 12 is shown in logic diagram form as comprising a synchronized signal generator circuit 28 and a shift register enable signal generator circuit 30. The synchronized signal generator circuit comprises an input D flip-flop 32, an output D flip-flop 34, a NOR gate 36 and an inverter 38. The D flip-flops are positive edge-triggered, and each have a D input, a clock input, a reset input, and an output. As is known by one of ordinary skill in the art, a positive-edge-triggered D flip-flop provides a signal on its output which was present on its D input when a signal on the clock input went from a low level to a high level unless the reset input is at the high level in which case the output is held at the low level. The high level is nominally a positive power supply voltage, and the low level is nominally ground potential.

The D flip-flop 32 has its D input connected to the positive power supply, $V_{DD}$, its clock input connected to the asynchronous signal terminal 22, its output connected to the D input of D flip-flop 34, and its reset input connected to the output of D flip-flop 34.

The D flip-flop 34 has its clock input connected to the synchronizing signal terminal 24. The output of D flip-flop 34 provides the synchronized signal to a synchronized signal terminal 42. The synchronized signal terminal is connected to the counter 14 shown in FIG. 1. The output of D flip-flop 34 is coupled to a first input of NOR gate 36 via inverter 38.

A second input of NOR gate 36 is connected to the synchronizing signal terminal 24. An output of NOR gate 36 is connected to the reset input of D flip-flop 34.

The asynchronous signal is present when it is at the high level. The D flip-flop 32 receives the asynchronous signal at terminal 22 when it goes from the low level to the high level at which time the output of D flip-flop 32 will go to the high level to provide a transfer signal. The synchronizing signal is present when it is at the high level. The D flip-flop 34 receives the synchronizing signal at terminal 24 when it goes from the low level to the high level. If the asynchronous signal has been received, then the D input of D flip-flop 34 is at the high level as provided by the transfer signal. When the synchronizing signal is received, the output of D flip-flop 34 will go to the high level. This is the synchronized signal which is provided to the counter on level 42 for updating its count. When the output of D flip-flop 34 goes to the high level, the output of D flip-flop 32 is reset to the low level due to a connection of the output of the D flip-flop 34 to the reset of D flip-flop 32.

When the synchronizing signal is removed, the output of D flip-flop 34 will be reset to the low level since the output of NOR gate 36 will go to the high level when the output of D flip-flop 34 is at the high level and the synchronizing signal is at the low level. When the output of D flip-flop 34 goes to the low level, D flip-flop 32 is then ready to receive another asynchronous signal since the reset of D flip-flop 32 is then at the low level. When the output of D flip-flop 34 is at the low level its reset input is also at the low level because the output is coupled to the reset input via inverter 38 and NOR gate 36.

The shift register enable signal generator circuit 30 comprises a transfer D flip-flop 44 and an AND gate 46. The D flip-flop 44 has its D input connected to the positive power supply, $V_{DD}$, its clock input connected to the output of inverter 38, its reset input connected to an output of AND gate 46, and its output connected to a first input of AND gate 46 and to a shift register transfer signal terminal 48 which is connected to the shift register 16 in FIG. 1. A second input of AND gate 46 is connected to the synchronizing signal terminal 24.

When the synchronized signal at the output of D flip-flop 34 goes from the high level to the low level, a high level is provided at the clock input of D flip-flop 44 which causes a high level on the output of the D flip-flop 44. This high level output is the shift register enable signal which is coupled to the shift register 16 in FIG. 1. The output remains at a high level until a synchronizing signal is received by AND gate 46 to reset D flip-flop 44. The other AND gate terminal is already high as it is connected to the output of D flip-flop 44. When the output goes to a low level, the output of AND gate 46 will be held low.

Figure 3:
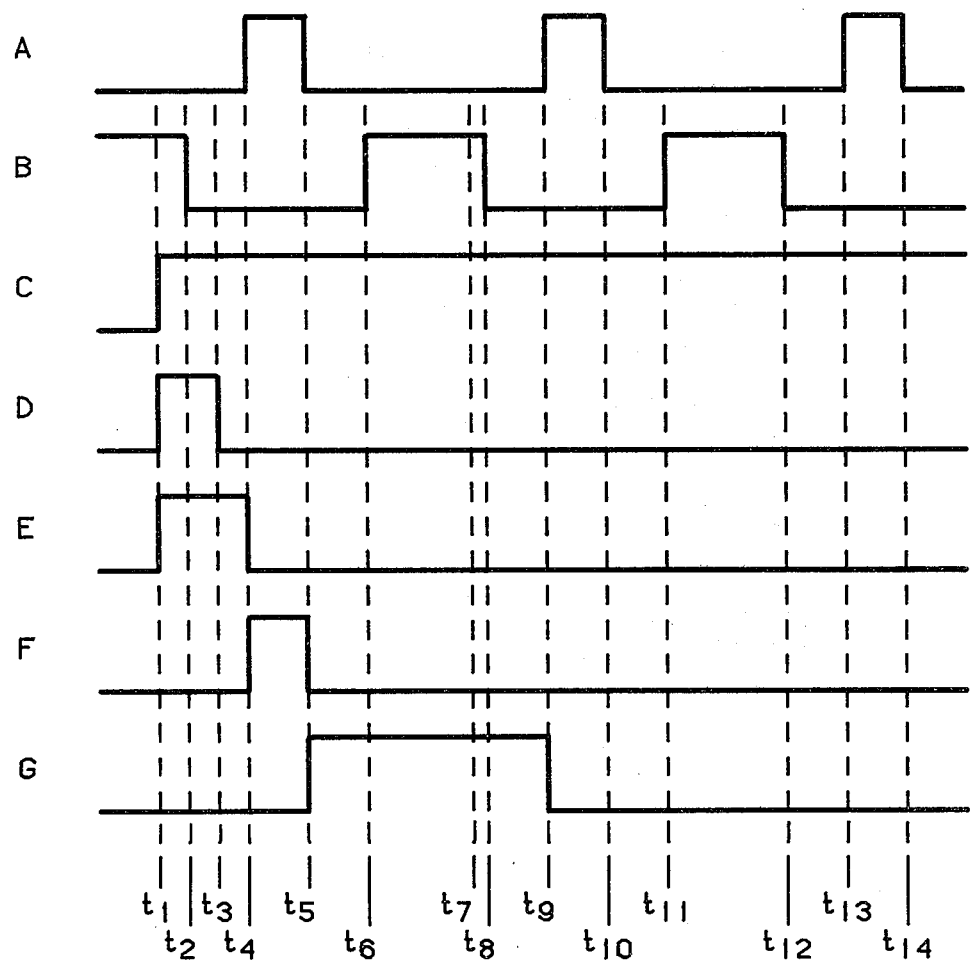
FIG. 3 is a timing diagram of the signals relevant to the operation of the synchronizing circuit of FIG. 2.

FIG. 3 is a timing diagram of certain relevant signals. Signal A is the synchronizing signal which may be an address strobe from the microcomputer.

Signal B is a data strobe of the microcomputer. The time during which the data strobe is high is the time during which the micromputer can perform a read function, such as reading the count of the counter. Signals C and D are two possible asynchronous signals, each of which will cause the same result. Signal E is the output of D flip-flop 32 in FIG. 2. Signal F is the synchronized signal provided by the output of D flip-flop 34 in FIG. 2 to the counter 14 in FIG. 1. Signal G is the shift register transfer signal provided by the output of D flip-flop 44 in FIG. 2 to the shift register in FIG. 1. The signals A and C-G are shown also in FIG. 2.

At time $t_1$, the asynchronous signal C or D is received at which time Signal E goes to the high level. At time $t_2$ the data strobe B goes to the low level but does not influence the peripheral interface adapter circuit 10 in FIG. 1. At time $t_3$ the possible asynchronous Signal D goes to the low level but also does not influence the peripheral interface adapter circuit 10 in FIG. 1. At time $t_4$ Signal A, the synchronizing signal, is received which causes Signal F, the synchronized signal, to go to the high level which causes the counter 14 in FIG. 1 to begin updating its count via terminal 42. At time $t_5$ Signal A, the synchronizing signal, is removed which causes Signal F, the synchronized signal, to go low and causes Signal G, the shifter register enable signal, to go to a high level. Signal G by conventional means, causes the shift register 16 in FIG. 1 to store the count of the counter 14 in FIG. 1. At time $t_6$ the microcomputer can begin the read function as indicated by Signal B going to the high level. Signal B, in this embodiment would interact only with Shift Register 16, the details of which are well known and not shown. Time $t_7$ is the time by which the counter must have completed the update of the count in order for the microcomputer to make a valid read of the count. At time $t_8$ the read must be completed by the microcomputer as indicated by Signal B going from the high level to the low level. The time from $t_7$ to $t_8$ is a minimum amount of time the microcomputer requires to make a valid read. This minimum amount of time is a specification characteristic of the microcomputer.

Because the counter begins its update at time $t_4$, the counter has from time $t_4$ to time $t_7$ to complete the update. The time from $t_4$ to $t_7$ has a minimum which is available from the specification characteristic of the microcomputer. Consequently, the counter is designed to complete its update in the minimum time from $t_4$ to $t_7$.

At time $t_9$ Signal A, the synchronizing signal, goes to the high level which causes Signal G, the shift register enable signal, to go to the low level. Because no other asynchronous signal has been received, there is no other response by the other signals in FIG. 3. Neither Signal C remaining at the high level nor Signal D going to the low level will cause a response. This shows that the peripheral interface adapter circuit 10 in FIG. 1 is not affected by how long the asynchronous signal is at the high level, i.e., is independent of duty cycle.

Because the asynchronous signals are received by D flip-flop 32 which is reset by a signal responsive to the synchronizing signal, the D flip-flop 32 can receive and store asynchronous signals with the same frequency as the synchronizing signal.

In the preferred embodiment positive edge-triggered D flip-flops are used as storage devices and signals are present when at the high level. That other storage devices are available and that signals can be present when at a low level or at a high level is well known. Modifications to the types of storage devices, the signal levels used, and other aspects of the preferred embodiment will be apparent to one of ordinary skill in the art. Accordingly, the appended claims are intended to cover all modifications of the invention which fall within the true spirit and scope of the invention.

I claim:

1. An interface circuit for providing in synchronization with a synchronizing signal, an output signal in response to an input signal, the interface circuit comprising:

first storage means for receiving the input signal and the output signal, the first storage means assuming a first logic state in response to the input signal and a second logic state in response to the output signal, and providing a transfer signal indicative of the logic state thereof;

second storage means for receiving the transfer signal, the synchronizing signal and a first reset signal, the second storage means assuming the logic state of the first storage means as indicated by the transfer signal in response to the synchronizing signal and the second logic state in response to the first reset signal, and providing the output signal indicative of the logic state thereof;

first reset logic means for receiving the synchronizing signal and the output signal, and for providing the first reset signal in response to the absence of the synchronizing signal, but only when the second storage means are in the first logic state as indicated by the output signal;

third storage means for receiving the output signal and a second reset signal, the third storage means assuming the first logic state in response to the second storage means assuming the second logic state as indicated by the output signal and the second logic state in response to the second reset signal, and providing an enable signal indicative of the logic state thereof; and second reset logic means for receiving the synchronizing signal and the enable signal, and providing the second reset signal in response to the presence of the synchronizing signal, but only when the third storage means are in the first logic state as indicated by the enable signal.

2. The interface circuit of claim 1 wherein the first, second and third storage means comprise positive-edge-triggered D flip-flops.

3. The interface circuit of claim 1 or 2 wherein the first reset logic means comprises a NOR gate and the second reset logic means comprise an AND gate.

4. A peripheral interface adapter circuit comprising:

synchronized signal generator means for receiving an asynchronous signal and a synchronizing signal, and providing a synchronized signal for each occurrence of the asynchronous signal which is followed by the synchronizing signal, the synchronized signal occurring only after the synchronizing signal is received;

counter means for receiving each synchronized signal, and providing a count of the received synchronized signals;

shift register means for receiving the count, a shift register enable signal and a timing signal, storing the received count in response to the received shift register enable signal, and providing the stored count in response to the received timing signal; and shift register enable signal generator means for receiving the synchronized signal, and providing the shift register enable signal in response to removal of the synchronized signal.

5. The peripheral interface adapter circit of claim 4, wherein the synchronized signal generator means comprises:

first storage means for receiving the asynchronous signal and the synchronized signal, the first storage means assuming a first logic state in response to the synchronized signal, and providing a transfer signal indicative of the logic state thereof;

second storage means for receiving the transfer signal, the synchronizing signal and a first reset signal, the second storage means assuming the logic state of the first storage means as indicated by the transfer signal in response to the synchronizing signal and the second logic state in response to the first reset signal, and providing the output signal indicative of the logic state thereof; and first reset logic means for receiving the synchronizing signal and the synchronized signal, and for providing the first reset signal in response to the absence of the synchronizing signal but only when the second storage means are in the first logic state as indicated by the synchronized signal.

6. The peripheral interface adapter circuit of claim 5, wherein the shift register enable signal generator means comprises:

third storage means for receiving the synchronized signal and a second reset signal, the third storage means assuming the first logic state in response to the second storage means assuming the second logic state as indicated by the synchronized signal and the second logic state in response to the second reset signal, and providing the shift register enable signal indicative of the logic state thereof; and second reset logic means for receiving the synchronizing signal and the shift register enable signal, and for providing the second reset signal in response to the presence of the synchronizing signal, but only when the third storage means are in the first logic state as indicated by the shift register enable signal.

7. An interface circuit comprising:
a first, positive-edge-triggered D flip-flop having a D input connected to a first logic level, a reset input, a clock input connected to receive a first input signal, and an output;
a second, positive-edge-triggered D flip-flop having a D input connected to the output of the first flip-flop, an output connected to the reset input of the first flip-flop, a clock input connected to receive a second input signal, and an output connected to provide an output signal;
an inverter having an input connected to the output of the second flip-flop, and an output;
a third, positive-edge-triggered flip-flop having a D input connected to the first logic level, a clock input connected to the output of the inverter, a reset input, and an output;
a NOR gate having a first input connected to the output of the inverter, a second input connected to receive the second input signal, and an output connected to the reset input of the second flip-flop; and
an AND gate having a first input connected to the output of the third flip-flop, a second input connected to receive the second input signal, and an output connected to the reset input of the third flip-flop.

* * * * *